United States Patent
Shen et al.

(10) Patent No.: US 8,685,783 B2
(45) Date of Patent: Apr. 1, 2014

(54) PHASE CHANGE MEMORY CELL

(75) Inventors: Ming-Huei Shen, Dounan Town (TW); Tsun Kai Tsao, Yongkang City (TW); Shih-Chang Liu, Alian Township (TW); Chia-Shiung Tsai, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 549 days.

(21) Appl. No.: 12/913,117

(22) Filed: Oct. 27, 2010

(65) Prior Publication Data
US 2012/0104339 A1    May 3, 2012

(51) Int. Cl.
*H01L 21/00* (2006.01)

(52) U.S. Cl.
USPC 438/95; 438/102; 257/E21.068; 257/E29.087; 257/E33.008

(58) Field of Classification Search
USPC ............. 438/95, 102; 257/E21.068, E31.008, 257/E29.087
See application file for complete search history.

(56) References Cited

U.S. PATENT DOCUMENTS

| | | | |
|---|---|---|---|
| 7,307,268 B2 | 12/2007 | Scheuerlein | |
| 7,324,365 B2 | 1/2008 | Gruening-von Schwerin et al. | |
| 7,598,112 B2 | 10/2009 | Park et al. | |
| 7,709,822 B2 * | 5/2010 | Karpov et al. | 257/4 |
| 7,718,989 B2 * | 5/2010 | Lai et al. | 257/2 |
| 2004/0038480 A1 | 2/2004 | Moore et al. | |
| 2005/0227496 A1 * | 10/2005 | Park et al. | 438/745 |
| 2007/0040159 A1 | 2/2007 | Wang | |
| 2008/0157053 A1 * | 7/2008 | Lai et al. | 257/4 |
| 2008/0191186 A1 * | 8/2008 | Lung et al. | 257/3 |
| 2009/0280509 A1 | 11/2009 | Lee et al. | |

FOREIGN PATENT DOCUMENTS

CN    101257087    9/2008

OTHER PUBLICATIONS

Office Action dated Mar. 28, 2013 from corresponding application No. CN201110092410.X.

* cited by examiner

*Primary Examiner* — Long K Tran
(74) *Attorney, Agent, or Firm* — Lowe Hauptman & Ham, LLP

(57) ABSTRACT

On a first structure having a first dielectric layer, a second dielectric layer, and a third dielectric layer a crown is formed through the third dielectric layer and the second dielectric layer. A fourth dielectric layer is deposited over the first structure and thereby is over the crown. A portion of the fourth dielectric layer is removed to form a first spacer having a remaining portion of the fourth dielectric layer. A portion of the third electric layer is also removed during the removal of the portion the fourth dielectric layer, resulting in a second spacer having a remaining portion of the third dielectric layer. A second structure is thereby formed. A phase change material layer is deposited over the second structure. An electrode layer is deposited over the phase change layer. Portions of the electrode layer and the phase change layer are removed by a chemical-mechanical-polishing process to form a phase change region having a remaining portion of the phase change layer and to form an electrode region having a remaining portion of the electrode layer.

20 Claims, 11 Drawing Sheets

PHASE CHANGE MEMORY CELL

TECHNICAL FIELD

The present disclosure is related to a phase change memory cell.

BACKGROUND

Phase change memory (PCM) is a type of non-volatile memory in which the state of a function area in the phase change material is switched between crystalline and amorphous, e.g., by a current flow that generates heat. The state of the function area is then used to represent the stored data. For example, after a heat excitation if the function area is in the crystalline state, the stored data is a low logic level (e.g., a Low). But if the function area is in the amorphous state, the stored data is a high logic level (e.g., a High). Phase change memory is also known as phase random access memory (PRAM), phase change random access memory (PCRAM), ovonic unified memory, chalcogenide random access memory (or C-RAM), etc. Approaches of manufacturing PCRAMs known to the applicants typically use etching techniques which are expensive and complicated, e.g., require more than one pattern mask.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
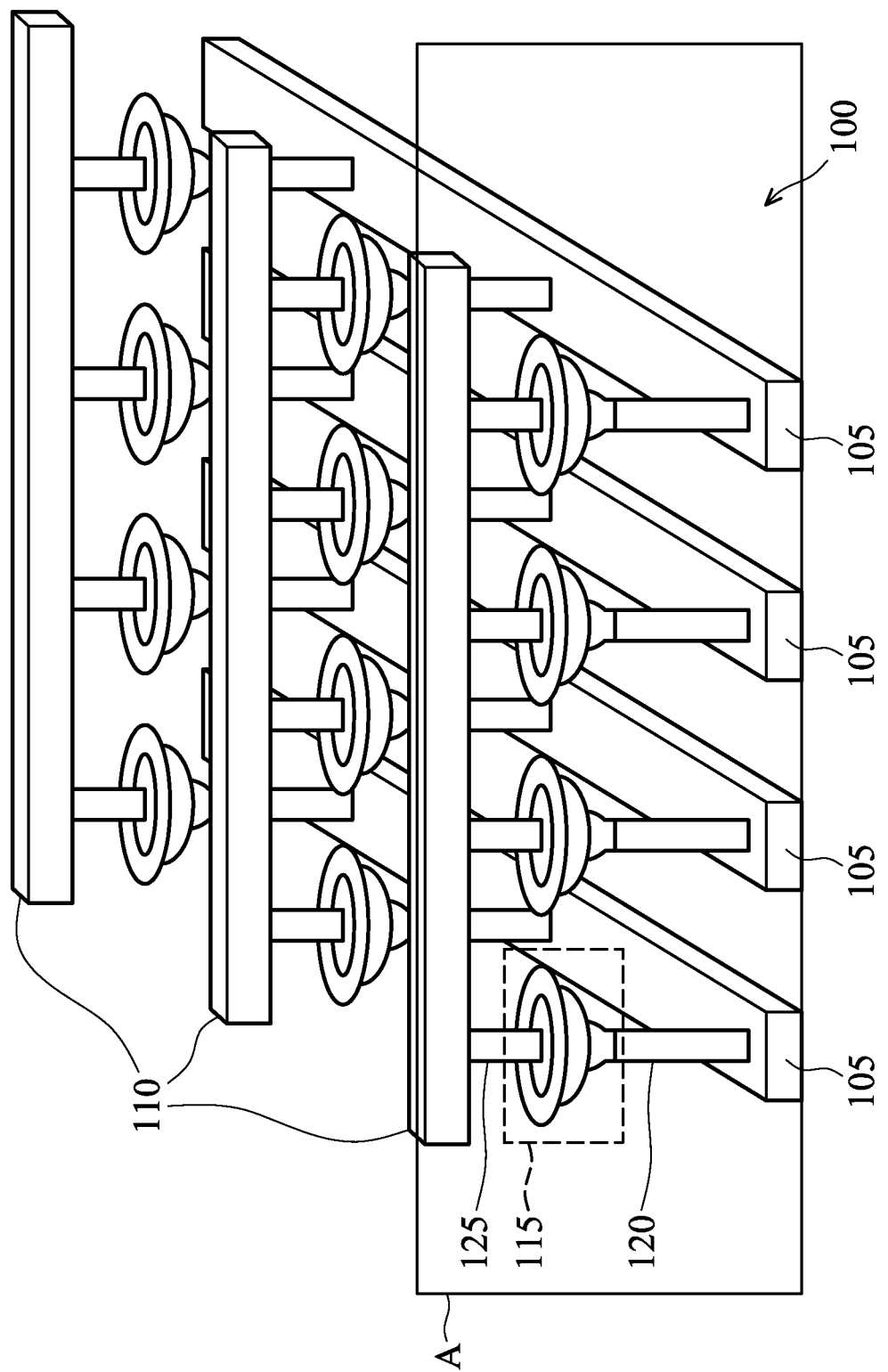
FIG. 1 is a three dimensional perspective view of a phase change memory array, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The PCRAM cell is easily identified based on the CMP process on the phase change material. One mask is used to create a crown of a PCRAM cell, which reduces manufacturing cost. The PCRAM cell can be used in a high density non-volatile flash memory. The electrode surface is wide and thus easily adapts the upper contact built on top the electrode surface.

Exemplary Phase Change Memory Cell and Structure

FIG. 1 is a three dimensional perspective view of a phase change (PC) memory array 100, in accordance with some embodiments.

PC memory array 100 includes four word lines 105 and three bit lines 110. A word line 105 is coupled to three memory cells 115, while a bit line 110 is coupled to four memory cells 115. For simplicity, only one memory cell 115 is labeled. A memory cell 115 is coupled to a word line 105 via a first contact region (e.g., a contact) 120, and is coupled to a bit line 110 via a second contact 125. In some embodiments, contacts 120 and 125 are made by Tungsten, but other metallic materials are within the scope of various embodiments. In at least one embodiment, word lines 105 are made of poly or other suitable materials. Contacts 120 serve as heaters wherein each heater generates heat that changes the characteristic of a corresponding function area 250 (FIG. 2B), i.e., changes the data stored in PC memory cells 115. In some embodiments, a current flowing through a contact 120 generates heat in that contact 120. Plane A denotes a reference plane for cross sectional views in FIGS. 2-10.

In FIG. 1, four word lines 105, three bit lines 110, the number of cells coupled to a word line 105 (e.g., three cells 115), and the number of cells coupled to a bit line 110 (e.g., four cells 115) are shown for illustration. In some embodiments, the number of word lines 105, the number of bit lines 110, and the number of memory cells 115 coupled to a word line 105 and/or a bit line 110 vary, and can be any positive integer.

Figure 2A:
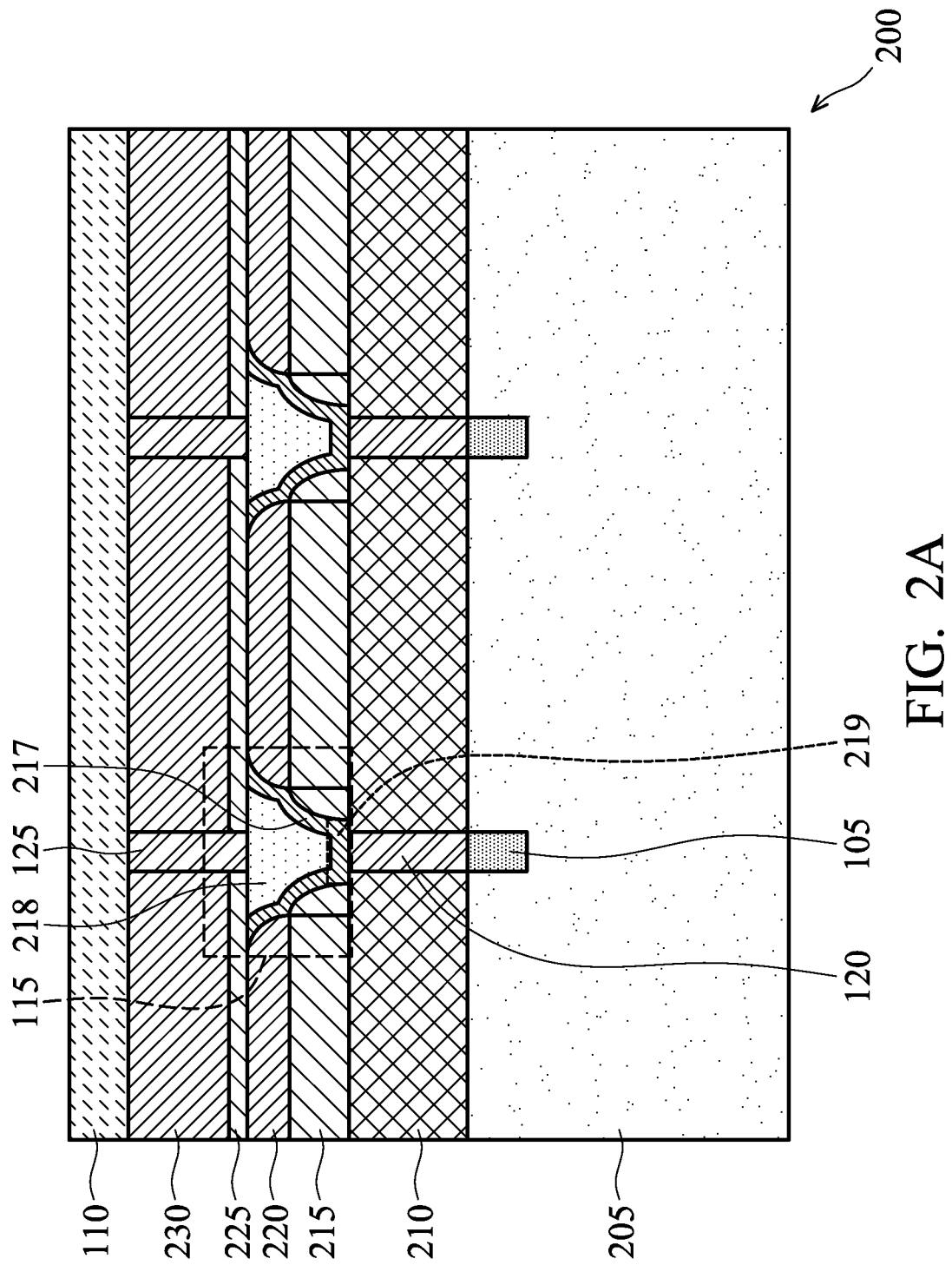
FIG. 2A is a cross sectional view of a phase change memory structure of the phase change memory array of FIG. 1, in accordance with some embodiments.

FIG. 2A is a cross sectional view of a structure 200 viewed along the reference plane A in FIG. 1, in accordance with some embodiments. The cross section reference plane A in FIG. 1 cuts through four memory cells 115. However, for illustration, only two memory cells 115 are shown in FIG. 2A. For simplicity, only details related to one memory cell 115 are labeled and described. Other memory cells 115 have similar elements and characteristics as those of the described memory cell 115.

In FIG. 2A, word lines 105 are in a substrate 205, and memory cells 115 and other layers and elements (e.g., dielectric layer 210, contacts 120, memory cells 115, etc.) are on top of substrate 205.

Contacts 120 are coupled to word lines 105, and are surrounded by a first dielectric layer 210 which, in some embodiments, is formed by Silicon Oxide ($SiO_2$) and/or other suitable materials. Those of ordinary skill in the art will recognize that Silicon Oxide is commonly called Oxide. First dielectric layer 210 has an etching selectivity different than that of second dielectric layer 215 which, in some embodiments includes Silicon Nitride (SiN) or as commonly called, Nitride. Dielectric layer 210 serves as a stop layer for dielectric layer 215. For example, in some embodiments etching is performed through Nitride layer 215 and stops on Oxide layer 210.

Memory cells 115 are on top of contacts 120. A memory cell 115 includes a phase change layer 217 and an electrode region 218. A phase change layer 217 includes a function area 250 (labeled in FIG. 3) disposed in an area 219 described below in connection with FIG. 3. In some embodiments, phase change layer 217 includes Germanium (Ge), Stibium (Sb), and/or Tellurium (Te), or the like, while electrode region 218 includes Titanium Nitride (TiN), Tatum Nitride (TaN), Tungsten, Aluminum copper, or other suitable electrode material. Electrode area 218 has a first surface below and in contact with contact 125, and a second surface above and in contact with phase change region 217. The first surface is larger than the second surface and is also larger than the surface of contact 125 for contact 125 to be easily adapted to (e.g., coupled to) electrode region 218 during manufacturing process. Memory cells 115 are surrounded by a third dielectric layer 220 on top of second dielectric layer 215 which serves as a stop layer for layer 220. In some embodiments, dielectric layer 220 includes Oxide, but other suitable dielectric materials, including Silicon-Rich Oxide (SRO), are within the scope of various embodiments. Similarly, in some embodiments, dielectric layer 215 includes Nitride, but other suitable dielectric materials, including Silicon Oxide Nitride (SiON), are within the scope of various embodiments. Silicon Oxide Nitride is commonly called Oxide Nitride.

A contact 125 is on top of an electrode region 218, and is surrounded by a fifth dielectric layer 230 on top of a fourth dielectric layer 225. In some embodiments, layer 225 includes Nitride. Layer 225 serves as a stop layer for layer 230. For example, a contact 125 is formed by etching through layer 230 and stops on layer 225, and then etched through layer 225 and stops on layer 220. In some embodiments, when two dielectric layers are next to each other, the etching selectivities of the two dielectric layers are selected to be different. For example, layer 225 has an etching selectivity higher than that of layer 230.

A bit line 110 is on top of contacts 125 and dielectric layer 230, and is electrically coupled to contacts 125.

Figure 2B:
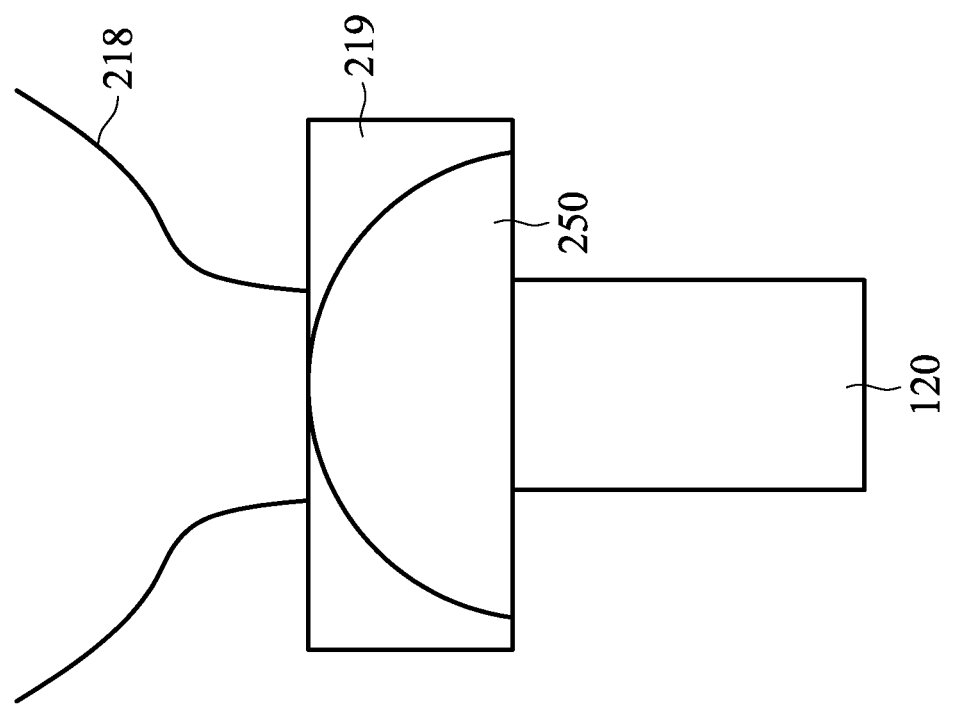
FIG. 2B is a cross sectional view of a phase change memory cell of the phase change memory array, in accordance with some embodiments.

FIG. 2B is an enlarged cross-sectional view of a portion of a memory cell 115 depicted in FIG. 2A, especially the area 219 of the memory cell 115, the contact 120, and an electrode region 218, in accordance with some embodiments. Function area 250 is part of area 219, which is a portion of phase change region 217. Function area 250 is also called a data storage region. In some embodiments, the resistive level (e.g., the resistance) of a corresponding function area 250 of a memory cell 115 represents the stored data in the memory cell 115. For example, when function area 250 is in the crystalline state, the resistance of function area 250 is low, and memory cell 105 is considered to be storing a High. But when function area 250 is in the amorphous state, the resistance of function area 250 is high, and memory cell 105 is considered to be storing a Low. A current (e.g., read current Ird or program current Iprg, not labeled) through a contact 120 generates heat in a corresponding function area 250 and causes function area 250 to change state. The bottom surface of function area 250 is shown larger than the surface of contact 120. In some other embodiments, it could be equal to or smaller than the surface of contact 120.

Exemplary Operation of a PC Memory Cell

Word lines 105, contacts 120, phase change regions 217, electrode regions 218, contacts 215, and bit lines 230 includes conductive materials that allow current to conduct through them. In some embodiments, a memory cell 115 operates in at least two modes, e.g., a program mode and a read mode. In a program mode for example, a current, e.g., programming current Iprg, is driven through a word line 105, a contact 120, and a phase change region 217 to change the state of the corresponding function area 250. In some embodiments, to change the state of the function area 250 into a crystalline state (to program a Low), current Iprg is at about 0.2 mA, and to change the state of the function area 250 into an amorphous state (to program a High), current Iprg is about 0.6 mA.

In a reading mode of a memory cell 115, a current, e.g., reading current Ird, is also driven through a word line 105, a contact 120, and a phase change layer 217. The data is then detected at a corresponding bit line 110 that reveals the data stored in a function area 250 and conducted through an electrode region 218, a contact 125, and a bit line 110. In some embodiments, when reading a High, current Ird is about 100 µA while, when reading a Low, current Ird is about 0.1 µA. Those of ordinary skill in the art will recognize that a voltage applied at word line 105 can generate the corresponding current Ird or Iprg.

Exemplary Steps to Manufacture PC Memory Cells

Figure 3:
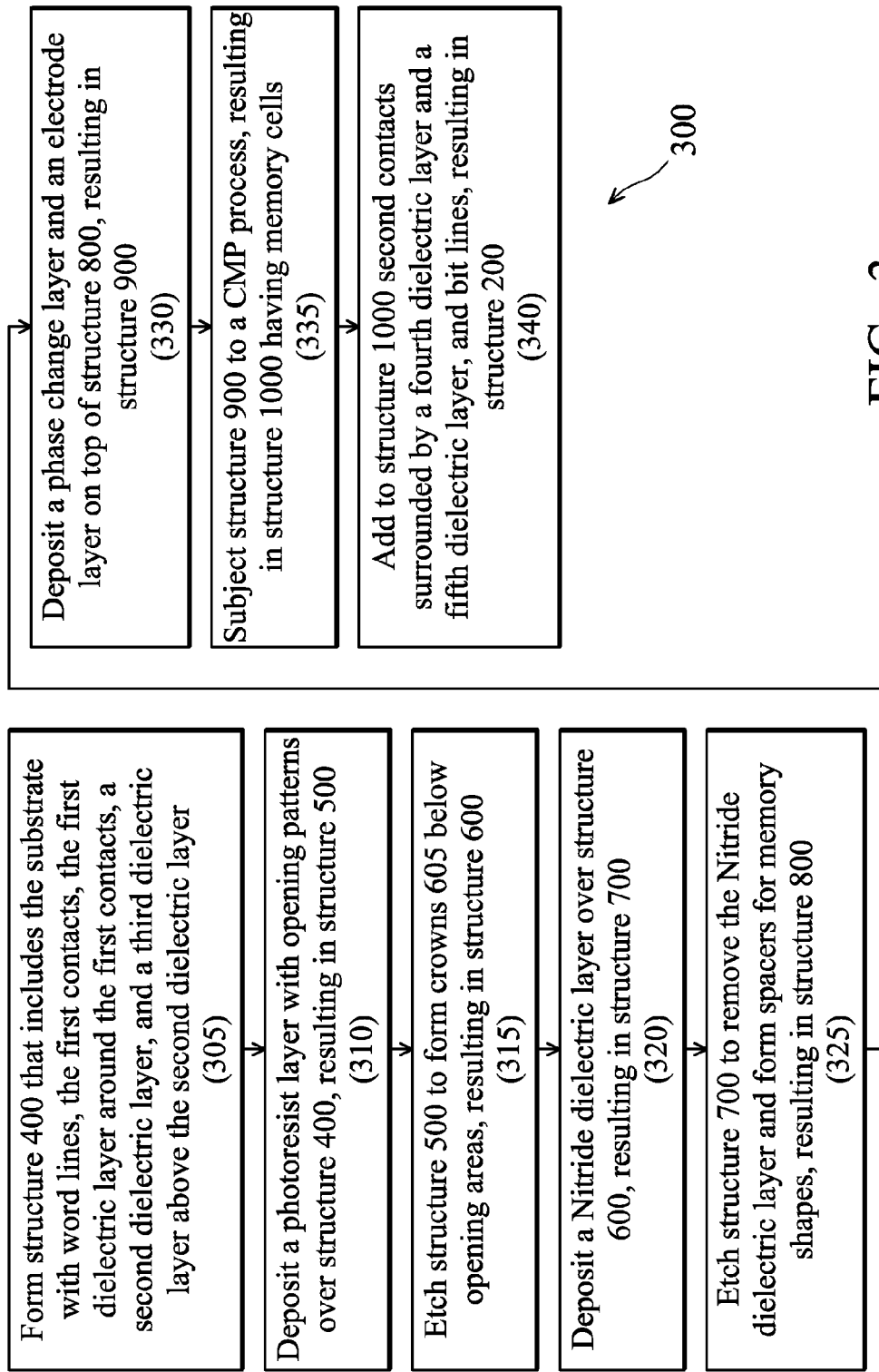
FIG. 3 is a flowchart illustrating a method of manufacturing the phase change memory array of FIG. 1, in accordance with some embodiments.
Figure 4:
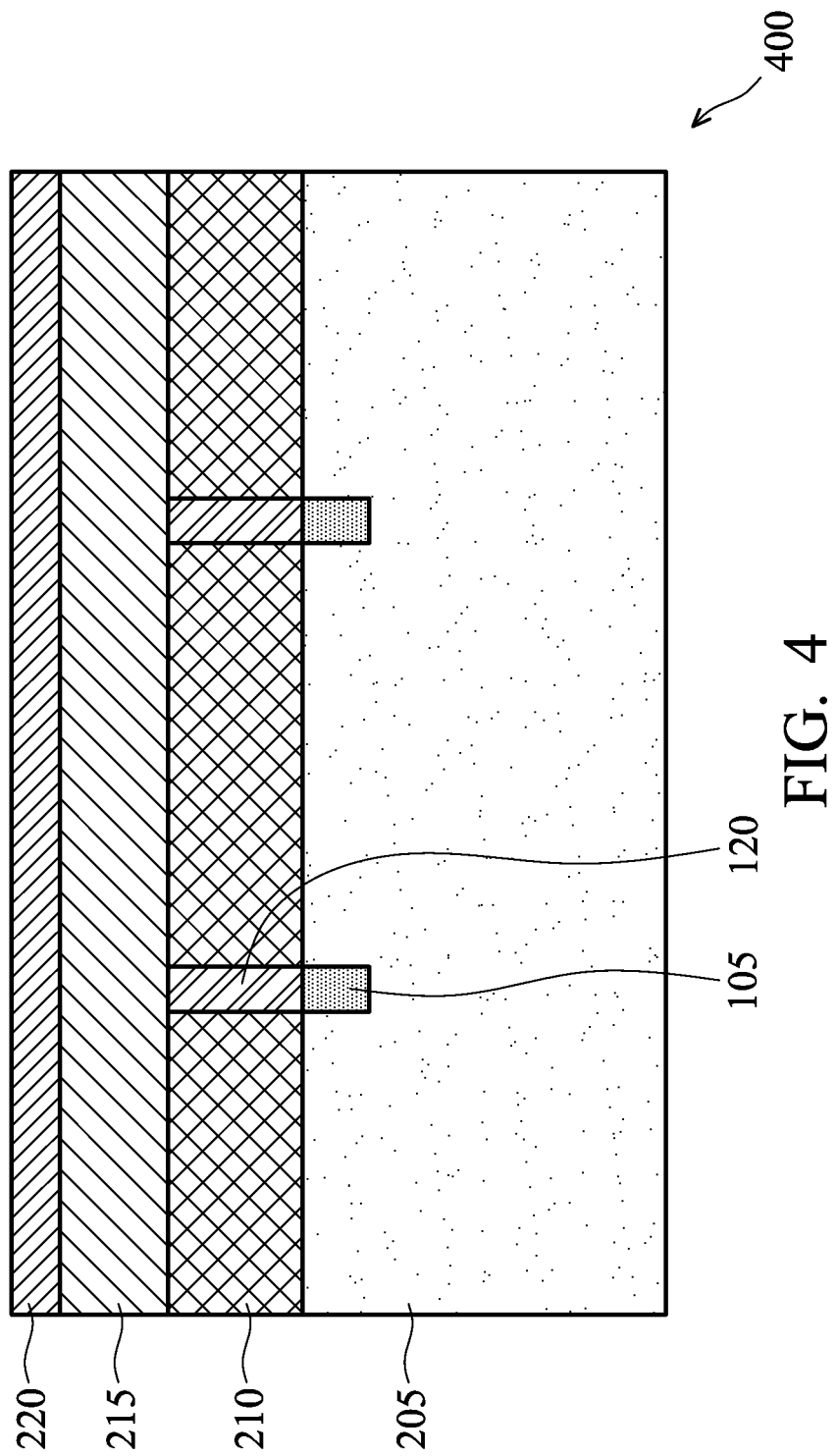
FIGS. 4-10 are cross sectional views of the phase change memory array of FIG. 1 in various manufacturing stages based on the method of FIG. 3, in accordance with some embodiments.

FIG. 3 is a flowchart illustrating a method 300 of manufacturing two PC memory cells 115 in FIG. 2A, in accordance with some embodiments. The described steps, however, can be used to manufacture different number of memory cells or a PC memory array (e.g., PC memory array 100 in FIG. 1) as would be readily understood by a person of ordinary skill in the art after reviewing this document. FIGS. 4-10 are cross sectional views of the phase change memory array of FIG. 1 in various manufacturing stages based on the method of FIG. 3, in accordance with some embodiments. The process steps in FIG. 3 correspond to structures 400-1000 in FIGS. 4-10, which are shown in cross sections.

In step 305, structure 400 is formed. Structure 400 includes substrate 205 having two word lines 105, two contacts 120, layers 210, 215, and 220 as explained above with reference to FIG. 2A. Structure 400 is manufactured by various techniques including those known in existing art. For example, in some embodiments, word lines 105 are formed in substrate 205. Dielectric layer 210 is deposited on top of substrate 205. Etching is done through layer 210 to form contacts 120. In some embodiments, a stop layer (e.g., layer 211, not shown) for layer 210 is also deposited on top of substrate 205, e.g., in between layer 210 and substrate 205. Layer 215 is then deposited on top of layer 210 and contacts 120, and layer 220 is deposited on top of layer 215. In some embodiments, layer 220 includes Oxide, and serves as a stop layer for the chemical-mechanical polishing (CMP) process in step 335, resulting in structure 1000 of FIG. 10. Those of ordinary skill in the art will recognize that CMP is a process of smoothing surfaces with the combination of chemical and mechanical forces.

Figure 5:
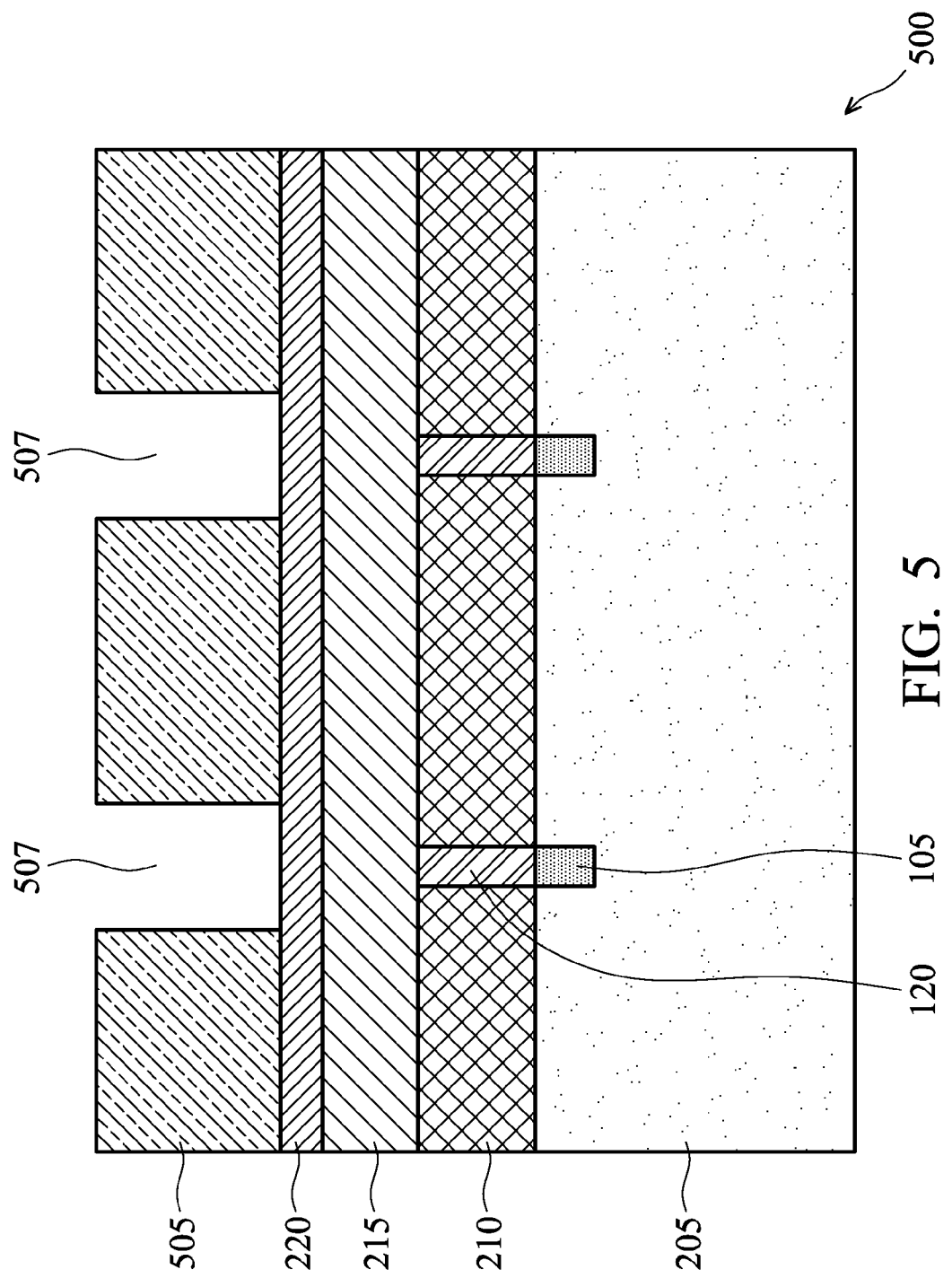

In step 310, structure 400 is deposited with a photo resist layer 505 on top of layer 220, resulting in structure 500 in FIG. 5. Photo resist layer 505 includes openings 507 to pattern the areas below openings 507 (e.g., the exposed portions of layer 220). Openings 507 are above contacts 120, and define, from the top view, the areas where memory cells 115 are later manufactured. Openings 507 have cross-sectional areas that are relatively larger than the surface of contacts 120 so that contacts 125, which have the same surface size with contacts 120, can later be built easily on top of electrode regions 218. For example, even if contacts 125 are deviated from overlying contacts 120, contacts 125 can still be coupled to elections regions 218 and provide a conduction path for memory cells 115 to function.

Figure 6:
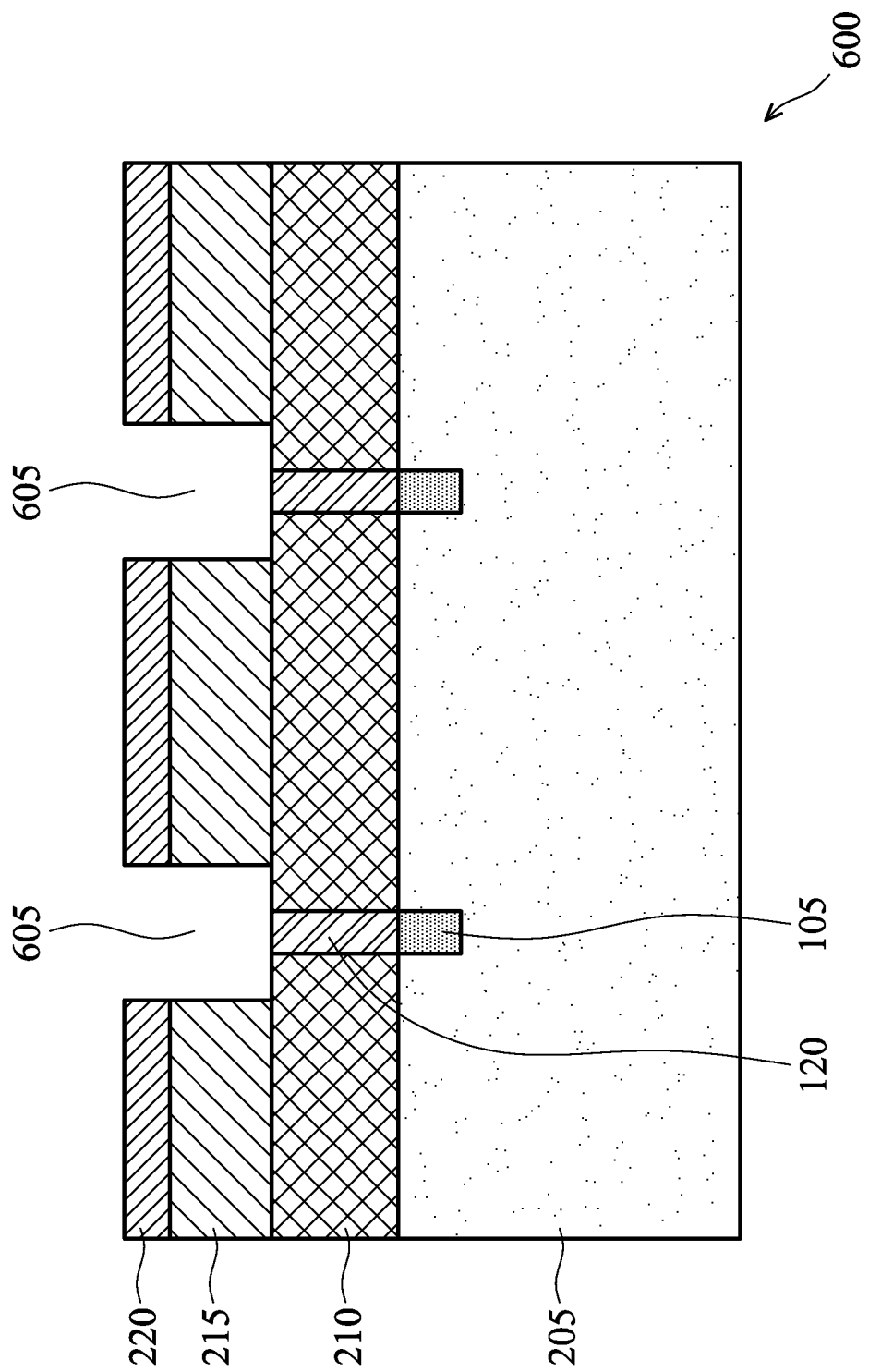

In step 315, structure 500 is etched, and photo resist layer 505 is removed to result in structure 600 in FIG. 6. Etching structure 500 is done in openings 507 into layers 220 and 215, and is stopped on layer 210 and contacts 120, which forms crowns 605 in layers 215 and 220 and on top of contacts 120.

In some embodiments, crowns 605 are round tubes. As a result, looking from the top view, crowns 605 are round, but different shapes (e.g., square, rectangular, eclipse, etc.) are within the scope of various embodiments.

Figure 7:
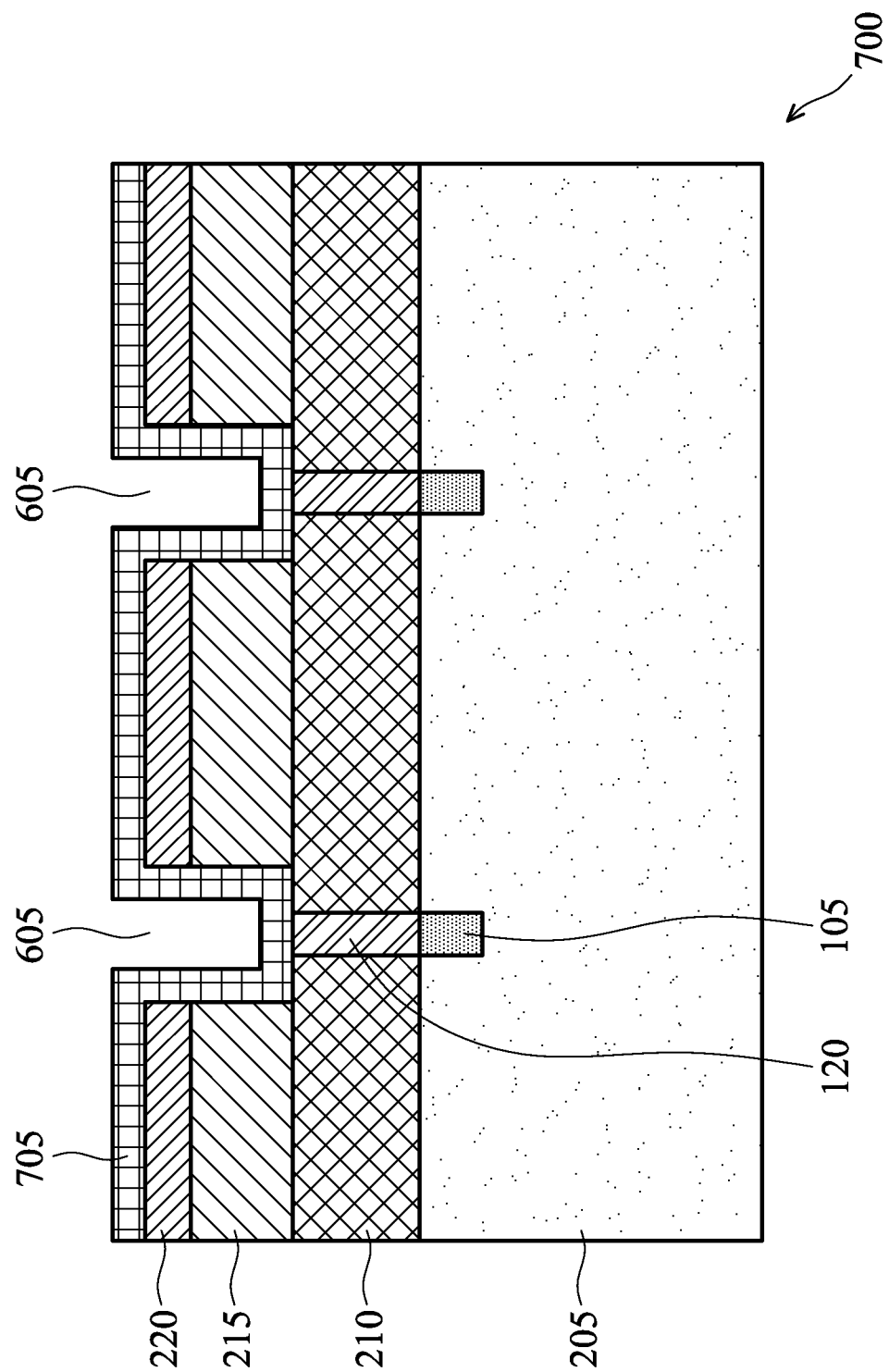

In step 320, structure 600 is deposited with a dielectric layer 705, resulting in structure 700 in FIG. 7. Layer 705 covers the surface of layer 220, the sidewalls and the bottom surfaces of crowns 605. Layer 705 also covers the tops of contacts 120 where the contact tops are exposed in structure 600. In some embodiments, layer 705 includes Nitride, but other suitable dielectric materials (e.g., Oxide Nitride) are within the scope of various embodiments. Depositing layer 705 is also called a spacer deposition because a spacer (e.g., spacer 810 in FIG. 8) is later built from layer 705. In some embodiments, layer 705 has a same thickness throughout different areas covered by layer 705. In some embodiments, layer 705 and layer 215 include the same material (e.g., Nitride). As a result, in those embodiments, there is no boundary between layer 705 and layer 215 in areas that they are in contact with each other.

Figure 8:
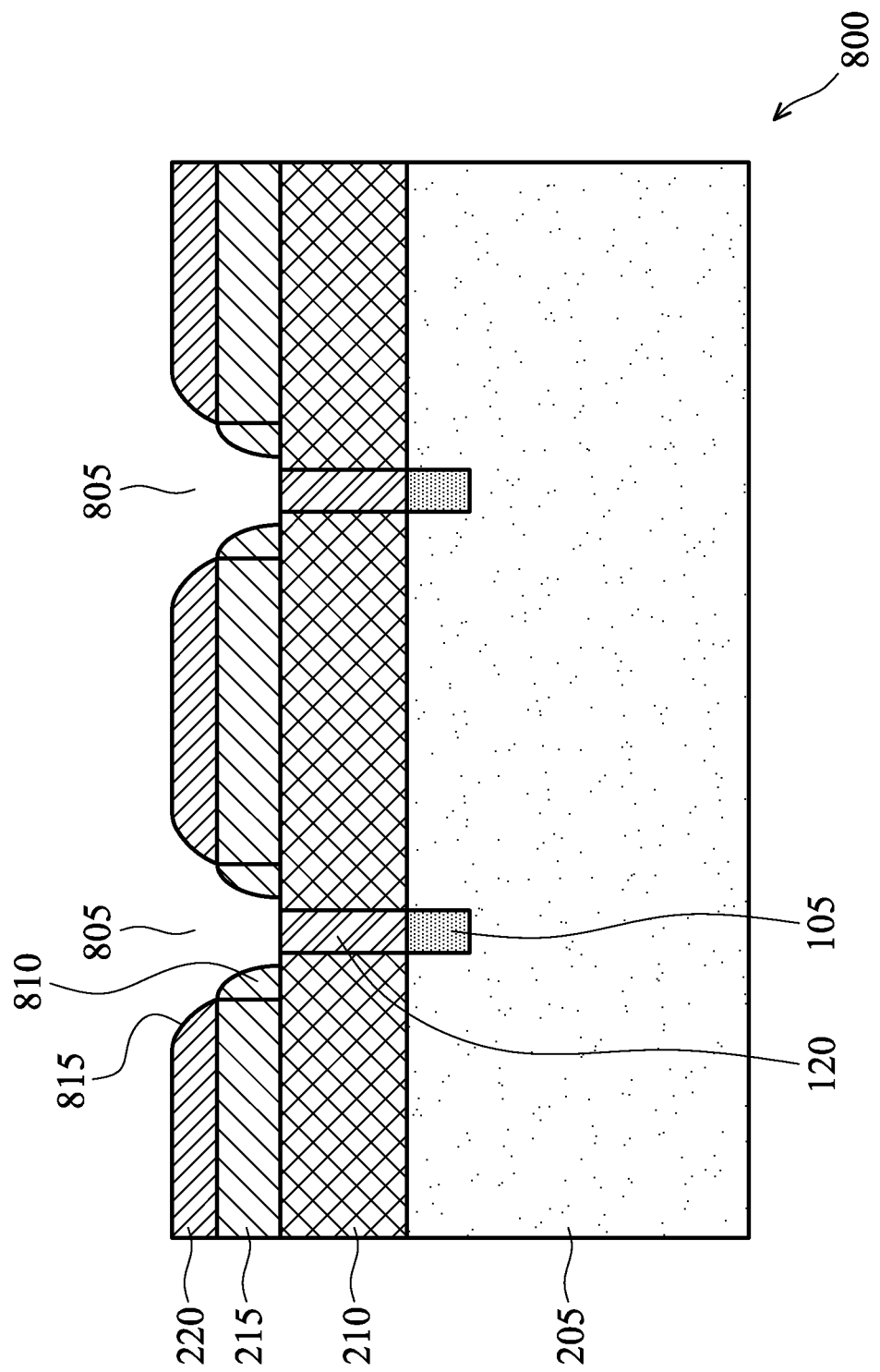

In step 325, structure 700 is etched to remove at least a portion of layer 705, resulting in structure 800 in FIG. 8. Structure 800 includes spacers 810 that are formed by the remaining portions of layer 705, which, in some embodiments, include Nitride. As a result, spacers 810 are also called Nitride spacers. If, however, layer 705 includes Oxide Nitride (SiON), spacers 810 are called Oxide Nitride spacers. During the removal of layer 705, a portion of layer 220 is also removed, and the remained portions of layer 220 form spacers 815. Spacers 815 are slanted such that the surface area of layer 220 is smaller than the surface area of layer 215. Alternatively stated, a spacer 815 has an opening wider than that of a spacer 810. In some embodiments, because spacers 815 have the same material as that of layer 220, which includes Oxide, spacers 815 are called Oxide spacers. If, however, layer 220 includes Silicon-Rich Oxide, then spacers 815 are called Silicon-Rich Oxide spacers, etc. In some embodiments, spacers 810 and 815 include plasma used in the physical bombardment of plasma to remove the portion of layer 705.

Spacers 815 and spacers 810 form shapes 805, which become the shape for memory cells 115. Shapes 805 are tapered, e.g., having a smaller portion near the area of contacts 120 (i.e., the bottom area) and flared portion in the area near layers 215 and 220 (e.g., the top area). Shapes 805 are tapered such that the phase change material (e.g., layer 905 in FIG. 9), when deposited on top of spacers 810, can be conformal (e.g., without gap) at corner areas near layer 210 and contacts 120. Further, because of the tapered shape, shapes 805 have a flared (e.g., wider) surface at the top, which defines a surface area for electrode region 218, so that contacts 125 can later be easily built on top of electrode regions 218. For example, even if contacts 125 are deviated from the center of shape 805, there is still conduction between an electrode region 218 and a contact 125, and the memory cell that includes electrode 218 can continue have conduction with the corresponding contact 125 to function. In the above illustration, crowns 605 are built having the same dimension from the top to the bottom, but spacers 815 and 810 are used to form smaller bottom areas of crowns 605.

Figure 9:
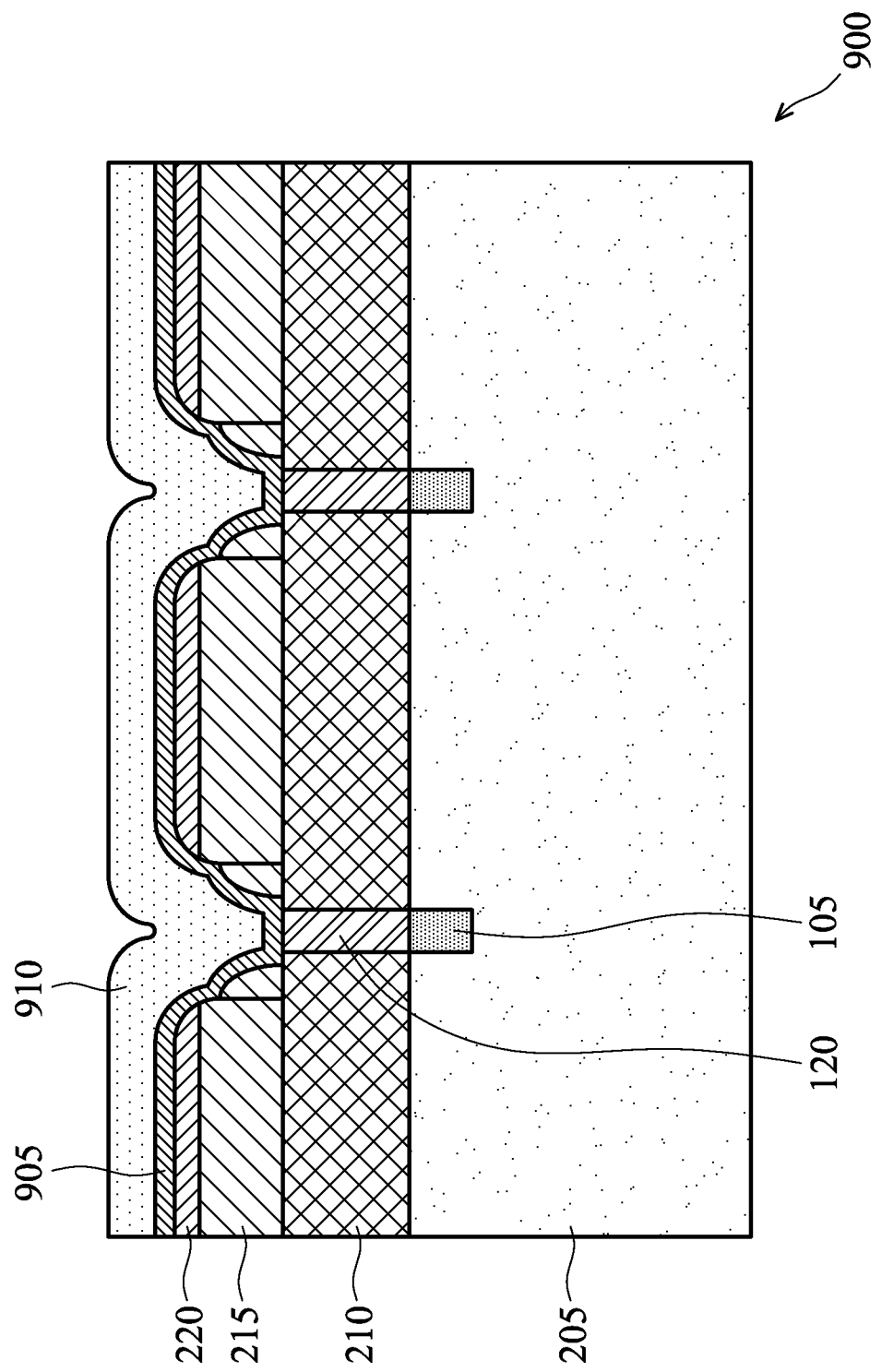

In step 330, structure 800 is deposited with a layer of phase change material (e.g., phase change layer) 905 and an electrode layer 910, shown as structure 900 in FIG. 9. In some embodiments, depositing layer 905 is done with a tool different from the tool used in depositing layer 910. Layer 905 is formed on top of structure 800. For example, layer 905 covers the exposed portions of layer 220, the exposed portion of layer 215, and the exposed surfaces of contacts 120, etc. In some embodiments, phase change material layer 905 has a same thickness of about 200 Angstroms, and includes Germanium (Ge), Stibium (Sb), and/or Tellurium (Te). Electrode layer 910 is formed on top of layer 905, and, depending on applications, is made of Titanium Nitride (TiN), Tatum Nitride (TaNi), Tungsten, Aluminum Copper (AlCu) or other suitable electrode materials.

Figure 10:
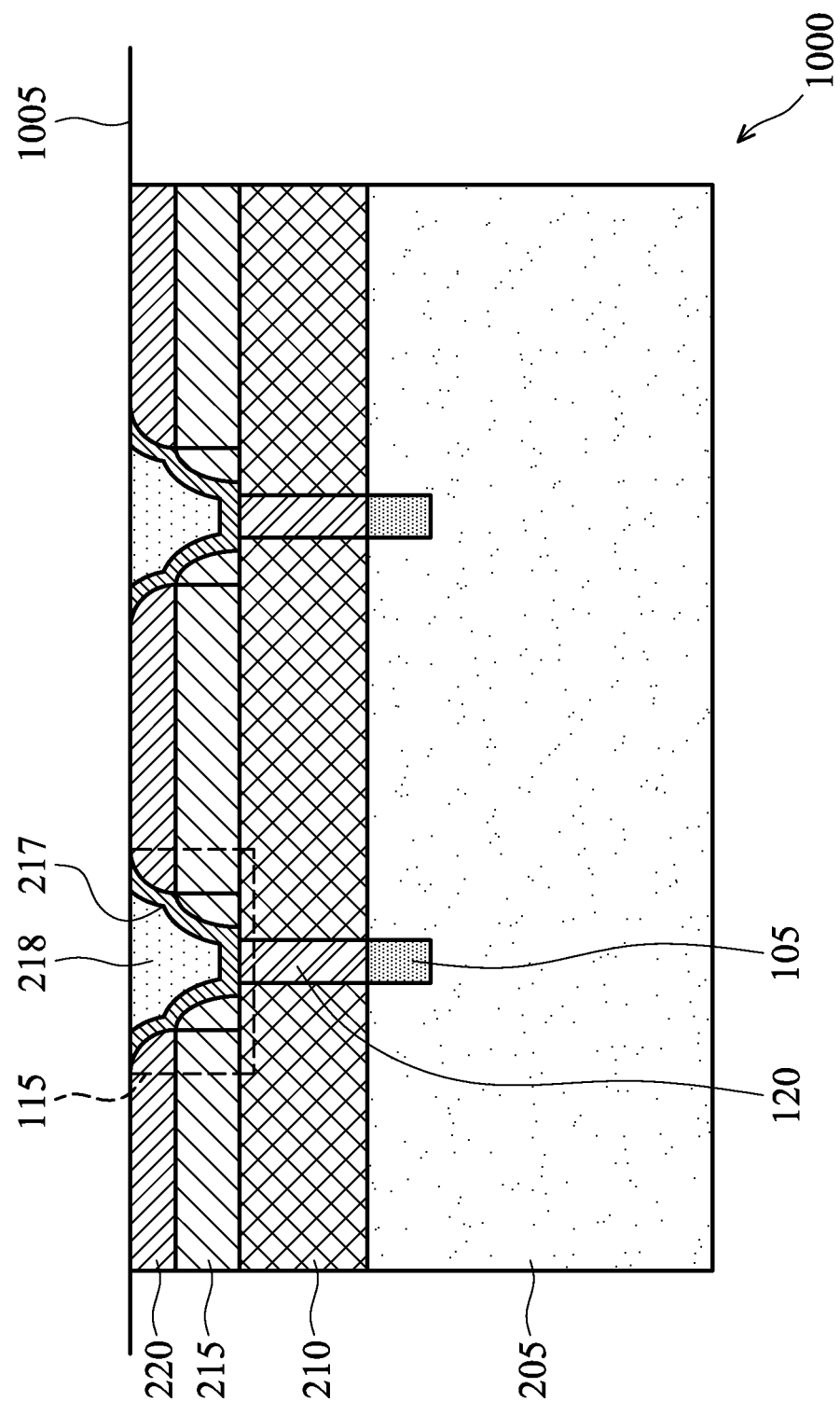

In step 335, structure 900 is subject to a chemical-mechanical-polishing (CMP) process to remove and polish layers 905 and 910 formed above layer 220, resulting in structure 1000 in FIG. 10. Removing the portions of layers 905 and 910 formed above layer 220 defines a surface 1005 that is a flat surface including the surface of layer 220, the top surface of phase change material layer 905, and the top surface of electrode layer 910 after being leveled. The remaining electrode layer 910 also enables later easy etching for contacts 125. Layer 220, a portion of phase change layer 905, and a portion of electrode layer 910 are exposed. The portions of phase change layer 905 and of electrode layer 910 remained within crowns 605 form phase change region 217 and electrode region 218 in each memory cell 115, respectively. In this step 335 of the embodiments of FIG. 3, CMP is performed after both phase change layer 905 and electrode layer 910 are deposited. In some other embodiments, phase change layer 905 is deposited then polished (e.g., with a CMP process), resulting in phase change region 217. Electrode layer 910 is then deposited on top of phase change region 217, and is polished (e.g., with a CMP process). Further, CMP process is used to polish layers 910 and 905, but other techniques including, for example, etching, are within the scope of various embodiments.

In step 340, structure 1000 is then subject to different manufacturing processes, resulting in structure 200 in FIG. 2, which is shown with substrate 205 and word lines 105 that, for simplicity, are not shown in FIGS. 5-10. To transform from structure 1000 to structure 200, contacts 125 are manufactured on top of electrode regions 218 of memory cells 115, and are surrounded by dielectric layers 225 and 230. Bit lines 110 are then built on top of contacts 125 (and thus dielectric layer 230). The processes in step 340 are done by various techniques including those known in existing art. For example, layers 225 and 230 are deposited, and etching is done through layers 230 and 225 to form contacts 125.

A number of embodiments have been described. It will nevertheless be understood that various modifications may be made without departing from the spirit and scope of the disclosure.

For example, some embodiments regard a first method that includes the following steps: on a first structure having a first dielectric layer, a second dielectric layer, and a third dielectric layer, forming a crown through the third dielectric layer and the second dielectric layer; depositing a fourth dielectric layer over the first structure and thereby over the crown; removing a portion of the fourth dielectric layer to form a first spacer having a remaining portion of the fourth dielectric layer; removing the portion of the fourth dielectric layer also removes a portion of the third dielectric layer and forms a second spacer having a remaining portion of the third dielectric layer, thereby forming a second structure; depositing a phase change material layer over the second structure; depositing an electrode layer over the phase change layer; and removing portions of the electrode layer and the phase change layer to form a phase change region having a remaining portion of the phase change layer and to form an electrode region having a remaining portion of the electrode layer, by a chemical-mechanical-polishing process.

For another example, some embodiments regard a second method that includes: forming a crown over a substrate; forming, inside the crown, a first spacer above a second spacer; the first spacer and the second spacer defining a first opening; the first spacer having a first-spacer opening larger than a second-spacer opening of the second spacer; forming a phase change region inside the first opening, thereby defining a second opening; and forming an electrode region inside the second opening. Forming the phase change region and forming the electrode region are done by one of the following sequences of steps: depositing a phase change layer over the first opening; depositing an electrode layer over the phase change layer; and removing portions of the phase change layer and the electrode layer to form the phase change region having a remaining portion of the phase change layer and to form the electrode region having a remaining portion of the electrode layer, by a first chemical-mechanical polishing process; or depositing the phase change layer over the first opening; removing a portion the phase change layer to form the phase change region, by a second chemical-mechanical-polishing process; depositing the electrode layer over the phase change region, then removing a portion of the electrode layer to form the electrode region, by a third chemical-mechanical-polishing process.

For another example, some embodiments regard a phase change memory cell that includes: a first contact; a phase change region above and in contact with the first contact; an electrode region; and a second contact above and in contact with the electrode region. The phase change region surrounds the electrode region. The electrode region has a first surface area in contact with the phase change region and a second surface area in contact with the second contact. The second surface area is larger than the first surface area.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method comprising:
   on a first structure having a first dielectric layer, a second dielectric layer, and a third dielectric layer
      forming a crown through the third dielectric layer and the second dielectric layer;
      depositing a fourth dielectric layer over the first structure and thereby over the crown;
      removing a portion of the fourth dielectric layer to form a first spacer having a remaining portion of the fourth dielectric layer; removing the portion of the fourth dielectric layer also removes a portion of the third dielectric layer and forms a second spacer having a remaining portion of the third dielectric layer, thereby forming a second structure;
      depositing a phase change layer over the second structure;
      depositing an electrode layer over the phase change layer; and
      removing portions of the electrode layer and the phase change layer to form a phase change region having a remaining portion of the phase change layer and to form an electrode region having a remaining portion of the electrode layer, by a chemical-mechanical-polishing process.

2. The method of claim 1 wherein forming the crown comprises using a photo resist layer having an opening corresponding to the crown on top of the first structure.

3. The method of claim 1 wherein the first spacer includes Silicon Nitride or Silicon Oxide Nitride, and the second spacer includes Silicon Oxide or Silicon-Rich Oxide.

4. The method of claim 1 wherein the first spacer and the second spacer cause the retained portion of the electrode to have a first end smaller than a second end.

5. The method of claim 1 further comprising forming a contact above the remained portion of the electrode layer.

6. The method of claim 5 wherein forming the contact comprises etching through a fifth dielectric layer below a sixth dielectric layer.

7. The method of claim 1 further comprising forming a contact below the remained portion of the phase change layer.

8. The method of claim 1 wherein the electrode layer includes Titanium Nitride, Tatum Nitride, Tungsten, or Aluminum Copper, and the phase change layer includes Germanium, Stibium, or Tellurium.

9. The method of claim 1 furthering comprising changing the phase change region between a crystalline state and an amorphous state.

10. A method comprising:
    forming a crown over a substrate;
    forming, inside the crown, a first spacer above a second spacer; the first spacer and the second spacer defining a first opening; the first spacer having a first-spacer opening larger than a second-spacer opening of the second spacer;
    forming a phase change region inside the first opening, thereby defining a second opening; and
    forming an electrode region inside the second opening;
    wherein forming the phase change region and forming the electrode region are done by one of the following steps:
       depositing a phase change layer over the first opening; depositing an electrode layer over the phase change layer; and removing portions of the phase change layer and the electrode layer to form the phase change region having a remaining portion of the phase change layer and to form the electrode region having a remaining portion of the electrode layer, by a first chemical-mechanical polishing process; or
       depositing the phase change layer over the first opening; removing a portion of the phase change layer to form the phase change region, by a second chemical-mechanical-polishing process; depositing the electrode layer over the phase change region, then removing a portion of the electrode layer to form the electrode region, by a third chemical-mechanical-polishing process.

11. The method of claim 10 further comprising forming a first contact below and in contact with the phase change region and a second contact above and in contact with the electrode region.

12. The method of claim 11 wherein the first contact is electrically coupled to a bit line and the second contact is electrically coupled to a word line.

13. The method of claim 11 wherein the first contact is configured to change a resistive characteristic of a portion of the phase change region.

14. The method of claim 10 furthering comprising changing the phase change region between a crystalline state and an amorphous state by a current through the first contact.

15. A method comprising:
    forming a first opening through a first dielectric layer;
    forming a first spacer within the first opening on a sidewall of the first dielectric layer;

forming a second spacer over an upper surface of the first dielectric layer and adjacent to the first spacer, the second spacer defining a second opening wider than the first opening;

forming a phase change layer over the first spacer and the second spacer; and removing a portion of the phase change layer that is over the second spacer by a chemical-mechanical-polishing process.

16. The method of claim 15, wherein the forming the second spacer comprises:

forming a second dielectric layer over the upper surface of the first dielectric layer, the first opening also being formed through the second dielectric layer; and removing a portion of the second dielectric layer for defining the second opening.

17. The method of claim 16, wherein the forming the first spacer comprises:

forming a third dielectric layer over an upper surface of the second dielectric layer and along side and bottom portions of the first opening; and removing a portion of the third dielectric layer that is over the upper surface of the second dielectric layer.

18. The method of claim 15, wherein the first spacer comprises Silicon Nitride or Silicon Oxide Nitride, and the second spacer comprises Silicon Oxide or Silicon-Rich Oxide.

19. The method of claim 15, further comprising:

prior to removing a portion of the phase change layer, depositing an electrode layer over the phase change layer.

20. The method of claim 19, wherein the electrode layer comprises Titanium Nitride, Tatum Nitride, Tungsten, or Aluminum Copper, and the phase change layer comprises Germanium, Stibium, or Tellurium.

* * * * *